United States Patent
Barna

(10) Patent No.: US 6,972,399 B2
(45) Date of Patent: Dec. 6, 2005

(54) RESET VOLTAGE GENERATION CIRCUIT FOR CMOS IMAGERS

(75) Inventor: Sandor L. Barna, Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 502 days.

(21) Appl. No.: 10/226,327

(22) Filed: Aug. 23, 2002

(65) Prior Publication Data

US 2004/0036787 A1 Feb. 26, 2004

(51) Int. Cl.[7] ............................ H04N 3/14; H01L 27/00
(52) U.S. Cl. .................................. 250/208.1; 348/308
(58) Field of Search ...................... 250/208.1, 214 R, 250/214 A, 214 SW; 348/294, 295, 301, 348/307, 308, 310; 257/290, 291, 292

(56) References Cited

U.S. PATENT DOCUMENTS

2003/0133030 A1 * 7/2003 Borg ........................... 348/308

* cited by examiner

*Primary Examiner*—Kevin Pyo
(74) *Attorney, Agent, or Firm*—Dickstein Shapiro Morin & Oshinsky LLP

(57) ABSTRACT

A reset voltage generator for CMOS imagers is disclosed. The voltage generator contains a "top" voltage generator and a "bottom" voltage generator, both of which are switched in and out of operation. A predetermined reset voltage is thereby generated independent of the power supply voltage (e.g., Vdd) and independent of any noise and/or voltage shifts associated with the power supply voltage.

47 Claims, 4 Drawing Sheets

RESET VOLTAGE GENERATION CIRCUIT FOR CMOS IMAGERS

FIELD OF THE INVENTION

The present invention relates generally to complementary metal oxide semiconductor (CMOS) imagers, and more particularly to a reset voltage generation circuit for CMOS imagers.

BACKGROUND OF THE INVENTION

CMOS active pixel sensor circuits are used in a variety of different types of digital image capture systems, including products such as scanners, copiers, and digital cameras. The image sensor is typically composed of an array of light-sensitive pixels that are electrically responsive to incident light reflected from an object or scene whose image is to be captured.

Integrated circuit imaging devices include an array of light-detecting elements interconnected to generate analog signals representative of an image illuminating the device. Within such an integrated circuit, each complementary metal oxide semiconductor (CMOS) image sensing element contained in the integrated circuit contains a light-detecting element (e.g., photodiode, phototransistor, etc.). In one example, charges are collected in accordance with the intensity of light illuminating the light-detecting element. By storing charge, an analog signal is thus generated having a magnitude approximately proportional to the intensity of light illuminating the light-detecting element.

In operation, a photo-sensitive diode is first reset by placing a fixed charge across the photodiode. Then, the photodiode is exposed to incident light which causes the charge stored on the photodiode to be dissipated in proportion to the intensity of the incident light. After a predetermined time period during which the photodiode is exposed to the incident light and charge is allowed to dissipate from the diode (i.e., the "integration" time), the amount of charge stored on the photodiode is transferred to a capacitor by opening a switch between the photodiode and the capacitor.

When the time arrives to read-out the charge on the capacitor, an address for that pixel is selected. After the charge on the capacitor has been read-out, the photodiode is reset by asserting a reset signal to a reset transistor and the reset potential which is distributed across the photodiode is read-out. The amount of incident light which is detected by the photodiode is computed by subtracting the voltage that is transferred from the capacitor from the reset voltage level on the photodiode.

In general, it is desirable to maximize the dynamic range of a CMOS image sensor. The dynamic range is defined as the ratio of the maximum amount of light that the imager can measure to the minimum amount of light it can detect. The minimum light level is basically the level of noise in the system. The maximum amount of light that can be measured is the number of photons that can be detected before the pixel saturates (i.e., reaches a voltage that cannot be read out).

The target voltage level to be applied to the pixel photodiode is a voltage level just below the power supply voltage. Since the pixel reset terminal voltage is reduced at the photodiode by the threshold voltage of the reset transistor, in order to increase the dynamic range of CMOS imagers, the voltage applied to the pixel reset terminal is typically raised so as to compensate for the threshold voltage drop across the reset transistor. As a result, the voltage applied to the pixel reset terminal is much closer to the power supply voltage (e.g., Vdd). The resulting dynamic range is increased since the reset voltage, which dissipates upon being exposed to incident light, now dissipates from a voltage level that is greater than it would otherwise be dissipated from if the voltage were not raised.

Typically, in order to arrive at the boosted reset voltage level, reset voltage generation circuits sample Vdd onto the top plate of a reset voltage capacitor and then raise the voltage on the bottom plate of the storage capacitor to produce a higher reset voltage. The initial sampling of the power supply voltage (e.g., Vdd) for generating the reset voltage is problematic in that it results in a reset voltage that is highly susceptible to power supply noise feedthrough. The introduction of noise into the image sensor results in inferior performance and should be avoided where possible and practicable to do so. Therefore, it is desirable to have a reset voltage generation circuit that does not introduce noise into the sensor array and that is independent of the power supply voltage.

BRIEF SUMMARY OF THE INVENTION

The present invention provides a reset voltage generator for CMOS imagers. The voltage generator contains a "top" voltage generator and a "bottom" voltage generator, both of which are switched in and out of operation. A predetermined reset voltage is thereby generated independent of the power supply voltage (e.g., Vdd) and independent of any noise and/or voltage shifts associated with the power supply voltage.

BRIEF DESCRIPTION OF THE DRAWINGS

The above and other features and advantages of the invention will be more readily understood from the following detailed description of the invention which is provided in connection with the accompanying drawings.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 1:
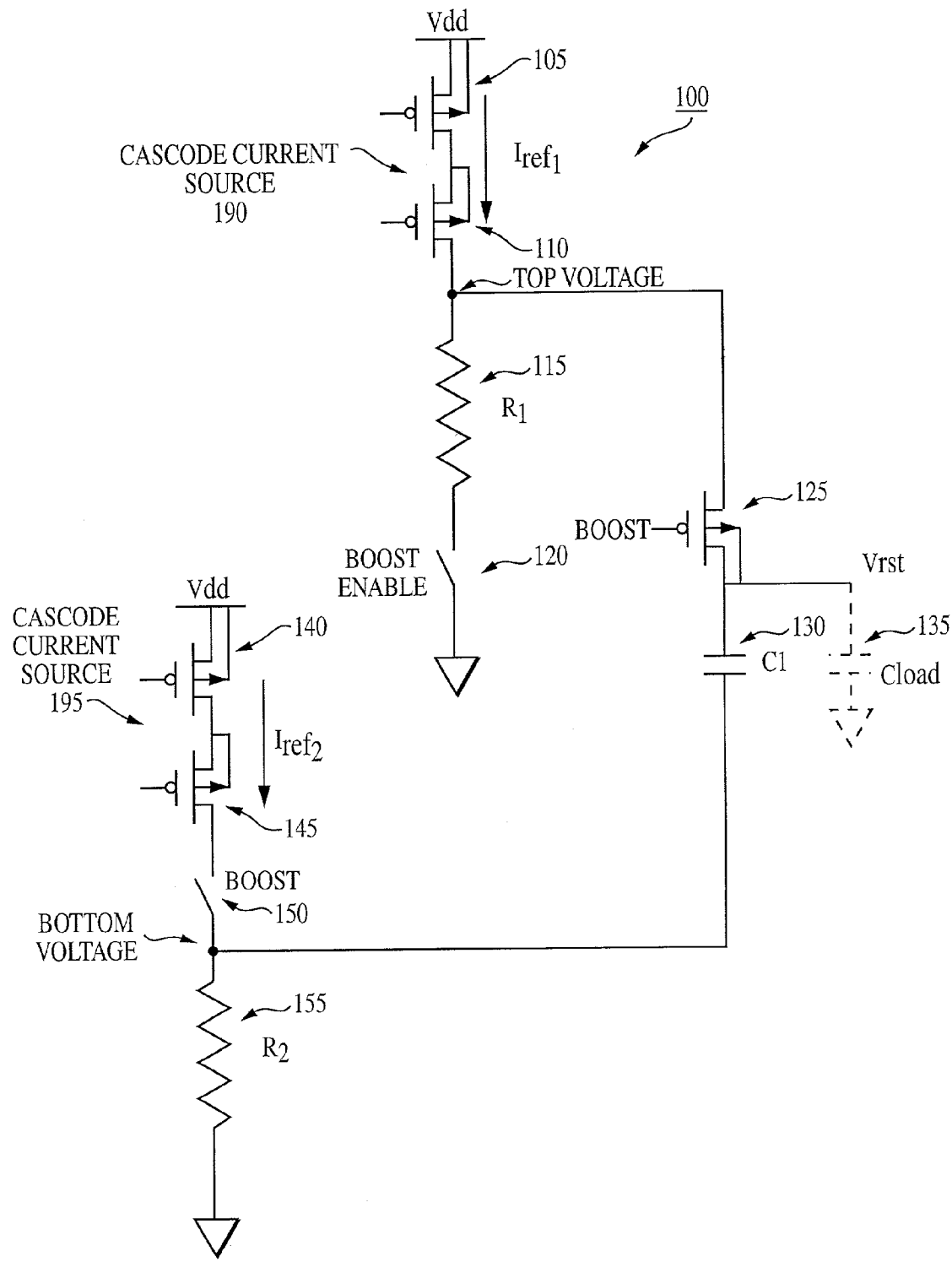
FIG. 1 depicts a schematic diagram of a reset voltage generator, in accordance with an exemplary embodiment of the invention.

With reference to FIG. 1, a schematic diagram of a reset voltage generator 100 is depicted, in accordance with an exemplary embodiment of the invention. The reset voltage generator 100 generates a reset voltage (Vrst) that is independent of the power supply voltage source (e.g., Vdd). In accordance with an exemplary embodiment of the invention, a first cascode current source 190 is made up of series coupled transistors 105, 110, one of which is coupled to a power supply voltage (e.g., Vdd). The series coupled transistors 105, 110 are further coupled in series with a first resistor $R_1$ 115, which is coupled in series with a boost enable switch 120. The other side of the boost enable switch is coupled to ground.

One terminal of $R_1$ 115 and a first source/drain terminal of transistor 110 are coupled to a first source/drain terminal of transistor 125. The n-well of p-type transistor 125 should be coupled to the output terminal, as depicted. The second source/drain terminal of transistor 125 is coupled to both a first terminal of capacitor (C1) 130 and the capacitance of the load (Cload) 135, where Cload 135 represents the capacitance of the row driver circuits and the pixels being reset as seen from the reset voltage generator. A second terminal of capacitor C1 130 is coupled to a first terminal of a second resistor $R_2$ 155. The first terminal of $R_2$ 155 is also coupled to a boost switch 150. A second terminal of $R_2$ 155 is coupled to ground.

A second terminal of boost switch 150 is coupled to a second cascode current source 195 made up of two series connected transistors 140, 145. A first source/drain terminal of transistor 140 is coupled to the power supply voltage (e.g., Vdd). A first source/drain terminal of transistor 145 is coupled to the boost switch 150.

It should be noted that first and second cascode current sources 190, 195 are each made up of two series connected transistors which are respectively biased using conventional current mirroring techniques. Such mirroring techniques are generally known and need not be further described herein.

Figure 2:
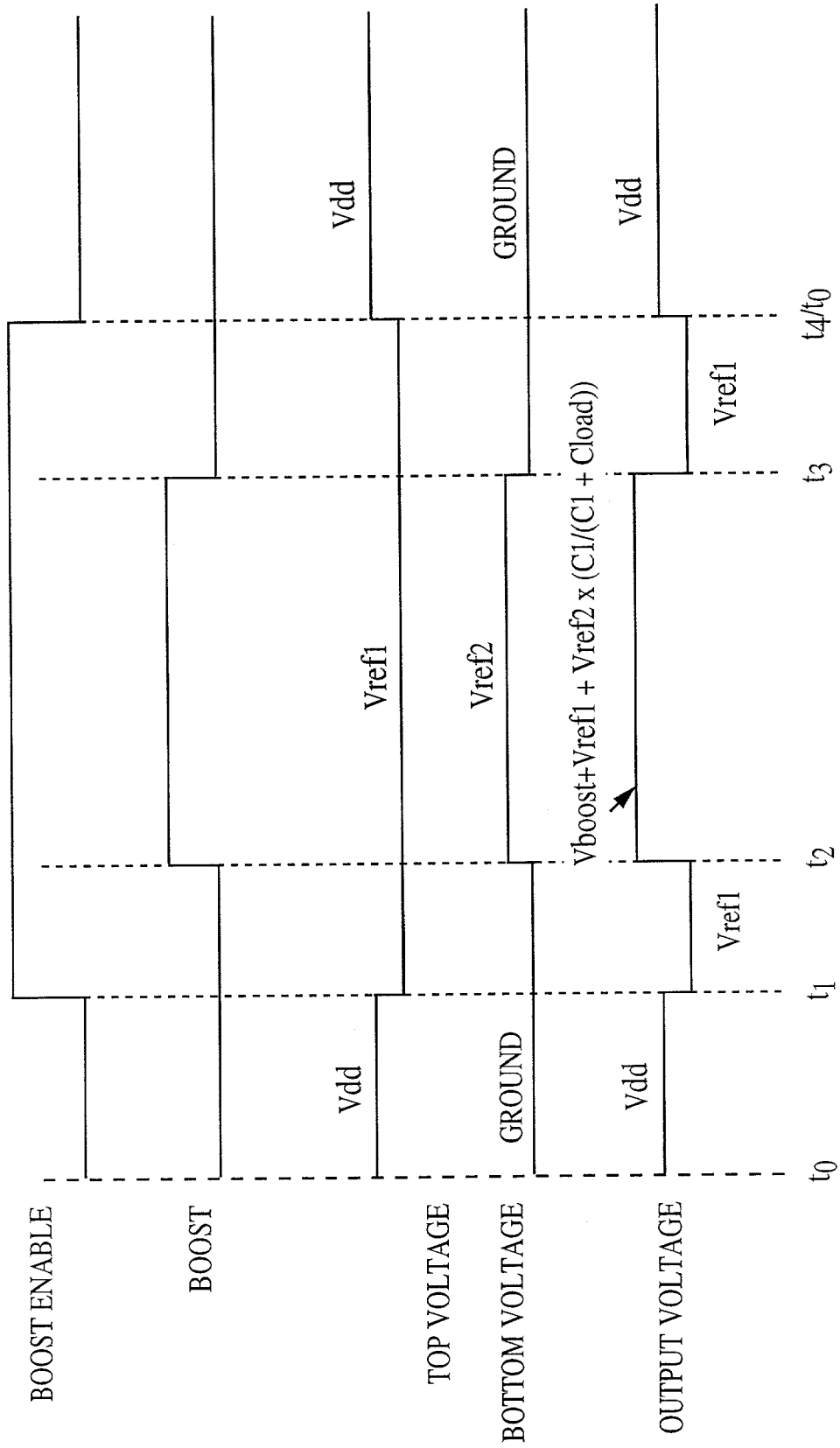
FIG. 2 depicts a timing diagram of the FIG. 1 reset voltage generator, in accordance with an exemplary embodiment of the invention.

Turning to FIG. 2, a timing diagram of the FIG. 1 reset voltage generator 100 is depicted, in accordance with an exemplary embodiment of the invention. At $t_0$, the steady state of the reset voltage generator 100 is depicted with the Boost Enable signal and the Boost signal at a logic LOW state (e.g., 0). Thus, boost enable switch 120 is open, boost switch 150 is open, and transistor 125 is activated. Still referring to $t_0$, the top voltage is set to Vdd and the bottom voltage is set to ground. As a result, the reset voltage Vrst is temporarily set to Vdd.

At $t_1$, the Boost Enable signal goes to a logic HIGH state (e.g., 1) and the Boost signal remains at a logic LOW state (e.g., 0). Thus, the boost enable switch 120 is closed, the boost switch remains open and transistor 125 remains activated. With boost enable switch 120 closed, current flows from Vdd through $R_1$ 115 to ground and the top voltage is changed from Vdd to $Vref_1$ (i.e., $Iref_1 \times R_1$). With the boost switch remaining open, the bottom voltage is still grounded. As a result, the reset voltage Vrst is temporarily at $Vref_1$. Further, capacitor C1 130 is charged to $Vref_1$, a voltage level somewhat lower than the power supply voltage (e.g., Vdd).

At $t_2$, the Boost Enable signal remains at a logic HIGH state and the Boost signal is switched to a logic HIGH state. Thus, the boost enable switch remains closed, and current still flows through $R_1$ 115 with the top voltage still set to $Vref_1$. In addition, the boost switch is closed and current begins to flow through $R_2$ 155 and the bottom voltage is set to $Vref_2$ (i.e., $Iref_2 \times R_2$). Further, transistor 125 is deactivated and, as a result, the reset voltage Vrst is set to approximately $Vref_1 + Vref_2 \times (C1/(C1+Cload))$.

Preferably, the capacitance value of C1 is much greater than that of Cload, so that the reset voltage will be close to $Vref_1 + Vref_2$. Since these voltages are not dependent on Vdd, the power supply noise is effectively rejected. This value for Vrst is the reset voltage that is used to reset the pixel (300 of FIG. 3) coupled to the reset voltage generator 100. In accordance with an exemplary embodiment of the invention, the voltage level of Vrst is slightly higher than the power supply voltage (e.g., slightly below Vdd+Vthreshold), and is also independent of the noise that can be found on the power supply voltage terminals.

At $t_3$, the Boost Enable signal remains at a logic HIGH state and the Boost signal switches to a logic LOW state. Thus, the boost enable switch 120 remains closed and current continues to flow through $R_1$. In addition, boost switch 150 is opened and transistor 125 is reactivated. The top voltage remains at $Vref_1$ and the bottom voltage switches to ground as current ceases to flow through $R_2$. As a result, the reset voltage Vrst is set to $Vref_1$. At $t_4$, the reset voltage generator 100 is returned to its steady state (as described in connection with $t_0$) until the next reset voltage generation cycle begins.

Figure 3:
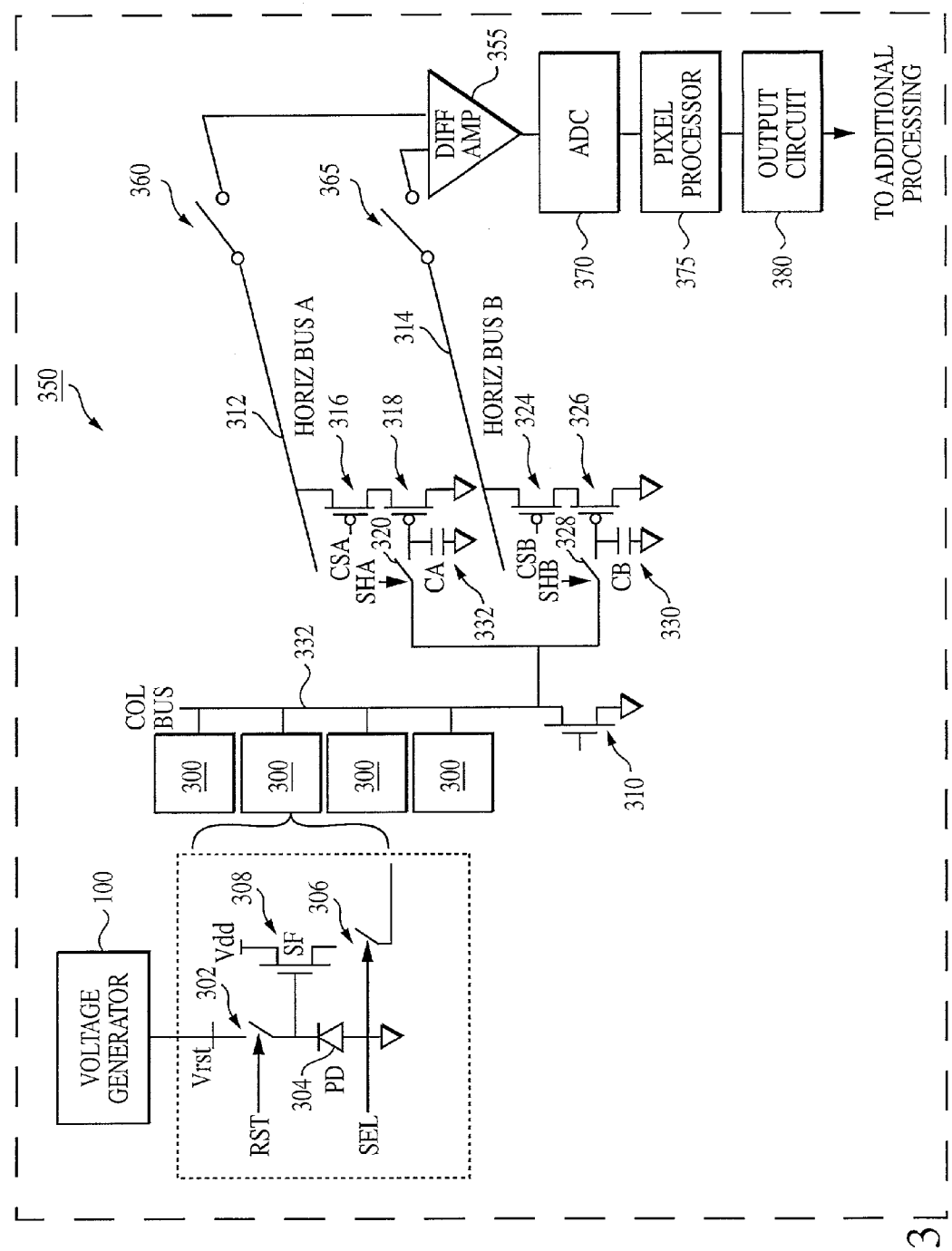
FIG. 3 depicts a simplified schematic diagram of a pixel sensor array, in accordance with an exemplary embodiment of the invention.

Turning now to FIG. 3, a portion of a pixel sensor array 350 utilizing the reset voltage generator 100 of the present invention is depicted. The pixel sensor array 350 contains a plurality of pixels 300 where each pixel 300 contains a reset transistor 302, a first terminal of which is coupled to the reset voltage generator 100, and a second terminal of which is coupled to a photodiode 304. The second terminal of reset transistor 302 is also coupled to a gate of source-follower transistor 308. A first source/drain terminal of source-follower transistor 308 is coupled to a source voltage terminal (e.g., Vdd), or alternatively, may be coupled to the reset voltage generator 100. A second source/drain terminal of source-follower transistor 308 is coupled to a row select transistor 306.

Row select transistor 306 is coupled to the column bus 332, which is coupled to a dual-stage sample and hold (SH) circuit. A first SH circuit consists of a first SH transistor 320. SH transistor 320 is also coupled to a first storage capacitor CA 322 and also coupled to series coupled transistors 318 and 316. Series coupled transistors 318 and 316 are also coupled to a first horizontal bus 312.

A second SH circuit consists of a second SH transistor 328. SH transistor 328 is also coupled to a second storage capacitor CB 330 and also coupled to series coupled transistors 326 and 324. Series coupled transistors 326 and 324 are also coupled to a second horizontal bus 314.

During operation, the photodiode 304 is reset by activating reset transistor 302, thereby charging the photodiode 304 to the reset voltage Vrst as provided by the reset voltage generator 100. This reset operation may occur at the end of a previous integration period for the pixel, or alternatively, may occur just prior to an immediately-following integration period for the pixel. The latter process is known as correlated double sampling. The reset transistor 302 is then deactivated and the photodiode 304 is exposed to incident light during an integration period. During the integration period, the photodiode 304 discharges in proportion to the intensity of the incident light.

The row select transistor 306 is then activated and the dissipated charge stored by the photodiode 304 is transferred to the column bus 332 and to the first SH circuit where the charge is stored on storage capacitor 322.

The photodiode 304 is reset again and the reset voltage level stored by the photodiode 304 is then transferred to the second SH circuit and stored in storage capacitor 330.

Thereafter, the two respective values stored by capacitors 322 and 330 are compared and the difference between the two voltage levels indicates the level of exposure of the photodiode 304 to the incident light.

Horizontal bus 312 and horizontal bus 314 are fed into respective inputs of a differential amplifier 355 when respective column select switches 360, 365 are closed. The output of the differential amplifier 355 is fed into an analog to digital converter (ADC) 370 for converting the analog difference signal into a digital value. The output of ADC 370 is fed into a pixel processor 375 for additional processing which may include compression of the digital values, forming of the resulting image, processing of damaged pixels, etc. The output of the pixel processor is fed into an output circuit 380, the output of which is then forwarded to additional processing (e.g., the data may then be forwarded to the peripheral bus 410 (of FIG. 4).

FIG. 3 also depicts the pixel sensor array 350 as being integrated onto or within a chip 380. The chip 380 may be made of any material suitable for use with pixel sensor arrays, including silicon-based materials, glass-based materials, etc.

Figure 4:
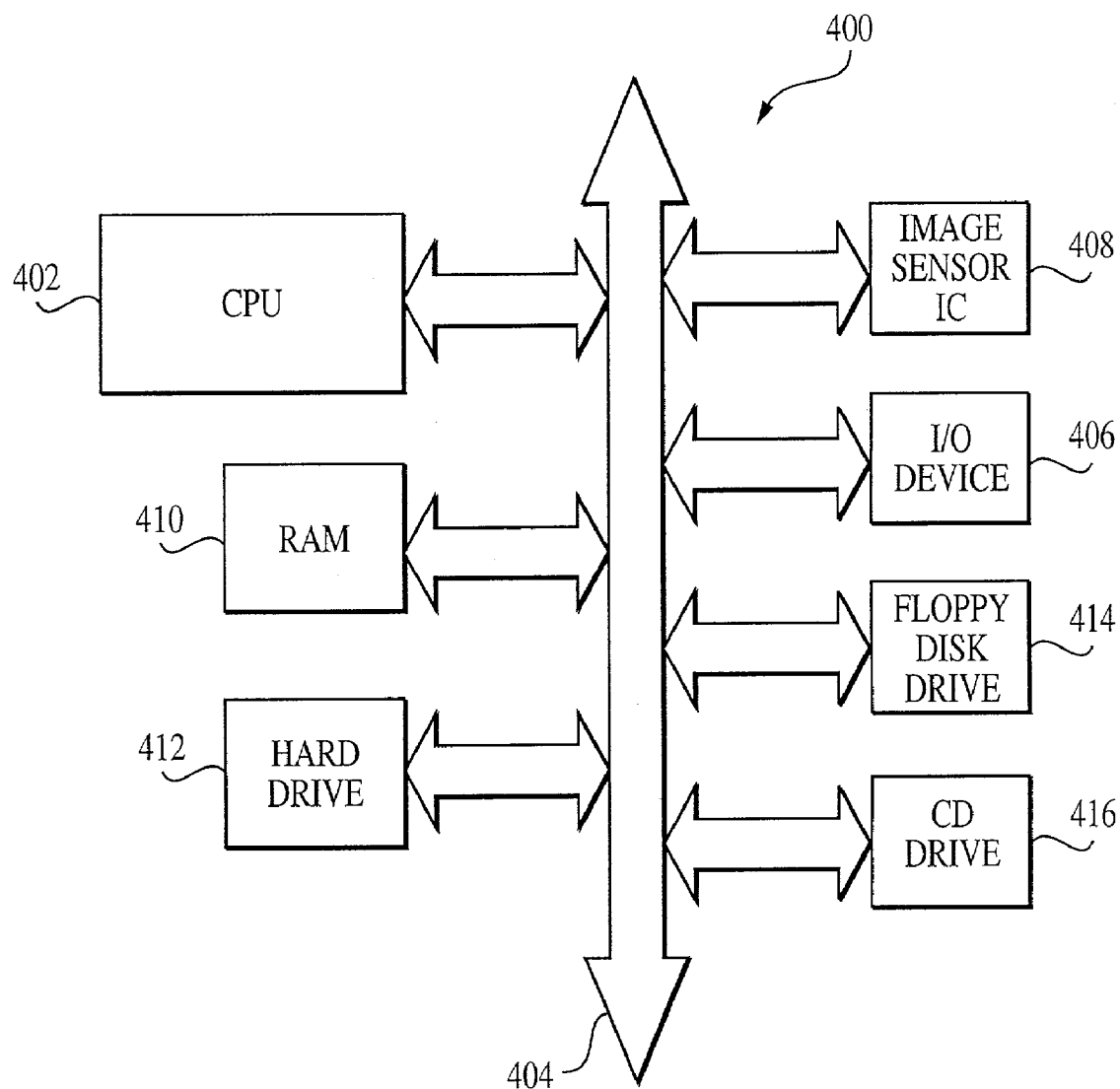
FIG. 4 depicts a simplified schematic diagram of a processor system, in accordance with an exemplary embodiment of the invention.

FIG. 4 shows system 400, a typical processor based system modified to include an image sensor IC as in FIG. 3. Processor based systems exemplify systems of digital circuits that could include an image sensor. Examples of processor based systems include, without limitation, computer systems, camera systems, scanners, machine vision systems, vehicle navigation systems, video telephones, surveillance systems, auto focus systems, star tracker systems, motion detection systems, image stabilization systems, and data compression systems for high-definition television, any of which could utilize the invention.

System 400 includes central processing unit (CPU) 402 that communicates with various devices over bus 404. Some of the devices connected to bus 404 provide communication into and out of system 400, illustratively including input/output (I/O) device 406 and image sensor IC 408. Other devices connected to bus 404 provide memory, illustratively including random access memory (RAM) 410, hard drive 412, and one or more peripheral memory devices such as floppy disk drive 414 and compact disk (CD) drive 416.

Image sensor 408 can be implemented as an integrated image sensor circuit on a chip with reset voltage generation circuitry, as illustrated in FIG. 3. Image sensor 408 may be combined with a processor, such as a CPU, digital signal processor, or microprocessor, in a single integrated circuit.

As described above, it is desirable to have a reset voltage for a pixel sensor array that contains as little noise as is practicable. Embodiments of the present invention have been described in which the reset voltage, Vrst, is generated based on values of a top voltage, as generated by a first cascode current source 190, and a bottom voltage, as generated by a second cascode current source 195. The reset voltage, Vrst is further dependent upon values of capacitors C1 and Cload, with the capacitance value of C1 most preferably being much greater than that of Cload. The resulting reset voltage, Vrst, is independent of Vdd and any noise inherent to the power supply voltage.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although an exemplary embodiment of the invention has been described in connection with cascoded current sources 190, 195, it should be readily understood that any other current source may be utilized for practicing the invention. The use of cascoded current sources, however, provide greater power supply isolation from Vdd. In addition, although a specific circuit configuration is depicted in connection with FIG. 1, it is depicted only for exemplary purposes and may be modified in any manner known to one of ordinary skill in the art. Accordingly, the invention is not limited by the foregoing description or drawings, but is only limited by the scope of the appended claims.

What is claimed as new and desired to be protected by Letters Patent of the United States is:

1. An image sensor system, comprising:
    a reset voltage generator;
    a reset voltage terminal for providing a reset voltage level derived from an output of said reset voltage generator to a complementary metal oxide semiconductor (CMOS) image sensor,
    wherein said reset voltage generator further comprises:
    a first voltage portion coupled to said reset voltage terminal for generating a nonzero first voltage level corresponding to a first component of said reset voltage level; and
    a second voltage portion coupled to said reset voltage terminal for generating a nonzero second voltage level corresponding to a second component of said reset voltage level.

2. The system of claim 1, wherein said reset voltage level is approximately equal to said first voltage level plus said second voltage level.

3. The system of claim 1 further comprising:
    a first capacitance (C1) coupled to said reset voltage terminal, a first terminal of said first capacitance being configured to be charged to said first voltage level (V1), a second terminal of said first capacitance (C1) being configured to be charged to said second voltage level (V2); and
    a second capacitance (C2) coupled to said reset voltage terminal, a first terminal of said second capacitance (C2) being configured to be charged to said first voltage level (V1).

4. The system of claim 3, wherein said reset voltage is approximately equal to V1+V2×(C1/(C1+C2)).

5. The system of claim 1, wherein said first voltage portion comprises:
    a first current source in series with a first resistive element, said first voltage level being approximately equal to a first current generated by said first current source multiplied by said first resistive element.

6. The system of claim 5, wherein said second voltage portion comprises:
    a second current source in series with a second resistive element, said second voltage level being approximately equal to a second current generated by said second current source multiplied by said second resistive element.

7. The system of claim 1, wherein said first voltage portion further comprises:
    a switch for switching said first voltage level corresponding to said first voltage component between said first voltage level and a voltage level approximately equal to a power supply voltage source of said system.

8. The system of claim 1, wherein said second voltage portion further comprises:
    a switch for switching said second voltage level corresponding to said second voltage component between said second voltage level and ground.

9. The system of claim 5, wherein said first current source comprises a cascoded current source.

10. The system of claim 6, wherein said second current source comprises a cascoded current source.

11. An image sensor, comprising:
a reset voltage generator;
at least one pixel configured to receive a reset voltage level to reset said pixel; and
a reset voltage terminal coupled to said at least one pixel and to said reset voltage generator for providing said reset voltage level to said pixel, said reset voltage level being derived from an output of said reset voltage generator;
a first voltage portion of said reset voltage generator coupled to said reset voltage terminal for generating a nonzero first voltage level corresponding to a first component of said reset voltage level; and
a second voltage portion of said reset voltage generator coupled to said reset voltage terminal for generating a nonzero second voltage level corresponding to a second component of said reset voltage level.

12. The image sensor of claim 11, wherein said reset voltage level is approximately equal to said first voltage level plus said second voltage level.

13. The image sensor of claim 11 further comprising:
a first capacitance (C1) coupled to said reset voltage terminal, a first terminal of said first capacitance being configured to be charged to said first voltage level (V1), a second terminal of said first capacitance (C1) being configured to be charged to said second voltage level (V2); and
a second capacitance (C2) coupled to said reset voltage terminal, a first terminal of said second capacitance (C2) being configured to be charged to said first voltage level (V1).

14. The image sensor of claim 13, wherein said reset voltage is approximately equal to $V1+V2\times(C1/(C1+C2))$.

15. The image sensor of claim 11, wherein said first voltage portion comprises:
a first current source in series with a first resistive element, said first voltage level being approximately equal to a first current generated by said first current source multiplied by said first resistive element.

16. The image sensor of claim 15, wherein said second voltage portion comprises:
a second current source in series with a second resistive element, said second voltage level being approximately equal to a second current generated by said second current source multiplied by said second resistive element.

17. The image sensor of claim 11, wherein said first voltage portion further comprises:
a switch for switching said first voltage level corresponding to said first voltage component between said first voltage level and a voltage level approximately equal to a power supply voltage source of said image sensor.

18. The image sensor of claim 11, wherein said second voltage portion further comprises:
a switch for switching said second voltage level corresponding to said second voltage component between said second voltage level and ground.

19. The image sensor of claim 15, wherein said first current source comprises a cascoded current source.

20. The image sensor of claim 16, wherein said second current source comprises a cascoded current source.

21. An image sensor integrated circuit, comprising:
a reset voltage generator;
at least one pixel configured to receive a reset voltage level to reset said pixel; and
a reset voltage terminal coupled to said at least one pixel and to said reset voltage generator for providing said reset voltage level to said pixel, said reset voltage level being derived from an output of said reset voltage generator;
a first voltage portion of said reset voltage generator coupled to said reset voltage terminal for generating a nonzero first voltage level corresponding to a first component of said reset voltage level; and
a second voltage portion of said reset voltage generator coupled to said reset voltage terminal for generating a nonzero second voltage level corresponding to a second component of said reset voltage level.

22. The integrated circuit of claim 21, wherein said reset voltage level is approximately equal to said first voltage level plus said second voltage level.

23. The integrated circuit of claim 21 further comprising:
a first capacitance (C1) coupled to said reset voltage terminal, a first terminal of said first capacitance being configured to be charged to said first voltage level (V1), a second terminal of said first capacitance (C1) being configured to be charged to said second voltage level (V2); and
a second capacitance (C2) coupled to said reset voltage terminal, a first terminal of said second capacitance (C2) being configured to be charged to said first voltage level (V1).

24. The integrated circuit of claim 23, wherein said reset voltage is approximately equal to $V1+V2\times(C1/(C1+C2))$.

25. The integrated circuit of claim 21, wherein said first voltage portion comprises:
a first current source in series with a first resistive element, said first voltage level being approximately equal to a first current generated by said first current source multiplied by said first resistive element.

26. The integrated circuit of claim 25, wherein said second voltage portion comprises:
a second current source in series with a second resistive element, said second voltage level being approximately equal to a second current generated by said second current source multiplied by said second resistive element.

27. The integrated circuit of claim 21, wherein said first voltage portion further comprises:
a switch for switching said first voltage level corresponding to said first voltage component between said first voltage level and a voltage level approximately equal to a power supply voltage source of said image sensor.

28. The integrated circuit of claim 21, wherein said second voltage portion further comprises:
a switch for switching said second voltage level corresponding to said second voltage component between said second voltage level and ground.

29. The integrated circuit of claim 25, wherein said first current source comprises a cascoded current source.

30. The integrated circuit of claim 26, wherein said second current source comprises a cascoded current source.

31. An image sensor integrated circuit, comprising:
a reset voltage generator for generating a reset voltage for a complementary metal oxide semiconductor (CMOS) image sensor, wherein
a first component of said reset voltage is generated by a first cascoded current source and a first resistive element, and wherein a second component of said reset voltage is generated by a second cascoded current source and a second resistive element; and a pixel array configured to receive said reset voltage.

32. A processor system, comprising:

a processor; and an image sensor array device coupled to said processor to provide signals to said processor, the array device comprising:

a reset voltage generator;

at least one pixel configured to receive a reset voltage level to reset said pixel; and a reset voltage terminal coupled to said at least one pixel and to said reset voltage generator for providing said reset voltage level to said pixel, said reset voltage level being derived from an output of said reset voltage generator, wherein said reset voltage generator further comprises:

a first voltage portion of said reset voltage generator coupled to said reset voltage terminal for generating a nonzero first voltage level corresponding to a first component of said reset voltage level; and a second voltage portion of said reset voltage generator coupled to said reset voltage terminal for generating a nonzero second voltage level corresponding to a second component of said reset voltage level.

33. The processor system of claim 32, wherein said reset voltage level is approximately equal to said first voltage level plus said second voltage level.

34. The processor system of claim 32, wherein said reset voltage generator further comprises:

a first capacitance (C1) coupled to said reset voltage terminal, a first terminal of said first capacitance being configured to be charged to said first voltage level (V1), a second terminal of said first capacitance (C1) being configured to be charged to said second voltage level (V2); and a second capacitance (C2) coupled to said reset voltage terminal, a first terminal of said second capacitance (C2) being configured to be charged to said first voltage level (V1).

35. The processor system of claim 34, wherein said reset voltage is approximately equal to V1+V2×(C1/(C1+C2)).

36. The processor system of claim 32, wherein said first voltage portion comprises:

a first current source in series with a first resistive element, said first voltage level being approximately equal to a first current generated by said first current source multiplied by said first resistive element.

37. The processor system of claim 36, wherein said second voltage portion comprises:

a second current source in series with a second resistive element, said second voltage level being approximately equal to a second current generated by said second current source multiplied by said second resistive element.

38. The processor system of claim 32, wherein said first voltage portion further comprises:

a switch for switching said first voltage level corresponding to said first voltage component between said first voltage level and a voltage level approximately equal to a power supply voltage source of said image sensor.

39. The processor system of claim 32, wherein said second voltage portion further comprises:

a switch for switching said second voltage level corresponding to said second voltage component between said second voltage level and ground.

40. The processor system of claim 36, wherein said first current source comprises a cascoded current source.

41. The processor system of claim 37, wherein said second current source comprises a cascoded current source.

42. A method for generating a reset voltage for a complementary metal oxide semiconductor (CMOS) image sensor, the method comprising:

driving a first current through a first resistive value to generate a first voltage level corresponding to a first component of said reset voltage;

driving a second current through a second resistive value to generate a second voltage level corresponding to a second component of said reset voltage; and providing said reset voltage to at least one pixel of said CMOS image sensor.

43. The method of claim 42 further comprising:

adding said first and second components to arrive at a voltage level approximately equal to said reset voltage level.

44. The method of claim 42 further comprising:

switching said first current on and off so as to switch said first voltage level between said first component of said reset voltage and a voltage level of a power supply voltage source of said image sensor.

45. The method of claim 42 further comprising:

switching said second current on and off so as to switch said second voltage level between said second component of said reset voltage and ground.

46. The method of claim 42, wherein said act of providing:

charging a first terminal of a first capacitor to said first voltage level;

charging a second terminal of said first capacitor to said second voltage level; and adding said first and second voltage levels to arrive at a voltage level approximately equal to said reset voltage level.

47. A method for resetting a pixel of a complementary metal oxide semiconductor (CMOS) image sensor array, the method comprising:

generating a first component of a reset voltage level by driving a first current through a first resistive element;

generating a second component of said reset voltage level by driving a second current through a second resistive element;

adding said first component and said second component to arrive at said reset voltage level; and delivering said reset voltage to said pixel.

* * * * *